(12) United States Patent
Fujiwara et al.

(10) Patent No.: US 10,202,506 B2
(45) Date of Patent: Feb. 12, 2019

(54) ELECTRONIC COMPONENT PACKAGING SHEET, AND FORMED ARTICLE THEREOF

(75) Inventors: Junpei Fujiwara, Isesaki (JP); Tomohiro Osawa, Isesaki (JP); Masatoshi Kawata, Isesaki (JP)

(73) Assignee: DENKA COMPANY LIMITED, Tokyo (JP)

( * ) Notice: Subject to any disclaimer, the term of this patent is extended or adjusted under 35 U.S.C. 154(b) by 731 days.

(21) Appl. No.: 13/877,750

(22) PCT Filed: Oct. 6, 2011

(86) PCT No.: PCT/JP2011/073125
§ 371 (c)(1),
(2), (4) Date: Apr. 4, 2013

(87) PCT Pub. No.: WO2012/046815
PCT Pub. Date: Apr. 12, 2012

(65) Prior Publication Data
US 2013/0189496 A1  Jul. 25, 2013

(30) Foreign Application Priority Data

Oct. 7, 2010 (JP) .................... 2010-227462
Dec. 24, 2010 (JP) .................... 2010-286980
Feb. 1, 2011 (JP) .................... 2011-020066

(51) Int. Cl.
| | |
|---|---|
| *H01B 1/20* | (2006.01) |
| *C08L 25/06* | (2006.01) |
| *B65D 73/02* | (2006.01) |
| *H05K 13/00* | (2006.01) |
| *C08L 33/04* | (2006.01) |
| *C08L 53/02* | (2006.01) |

(52) U.S. Cl.
CPC .............. *C08L 25/06* (2013.01); *B65D 73/02* (2013.01); *C08L 33/04* (2013.01); *C08L 53/02* (2013.01); *H01B 1/20* (2013.01); *H05K 13/0084* (2013.01); *B65D 2213/02* (2013.01); *C08L 2203/16* (2013.01); *C08L 2205/02* (2013.01); *C08L 2205/16* (2013.01); *Y10T 428/24612* (2015.01); *Y10T 428/25* (2015.01); *Y10T 428/254* (2015.01); *Y10T 428/31533* (2015.04); *Y10T 428/31913* (2015.04); *Y10T 428/31917* (2015.04)

(58) Field of Classification Search
None
See application file for complete search history.

(56) References Cited

U.S. PATENT DOCUMENTS

| | | | |
|---|---|---|---|
| 4,446,278 A | 5/1984 | Loucks | |
| 6,063,488 A | 5/2000 | Sato et al. | |
| 6,933,343 B2 | 8/2005 | Ikematsu et al. | |
| 7,341,793 B2 | 3/2008 | Ishii et al. | |
| 2002/0045702 A1* | 4/2002 | Nakamura | C07C 69/54 524/801 |
| 2003/0211331 A1* | 11/2003 | Louwet et al. | 428/419 |
| 2005/0124739 A1 | 6/2005 | Oda et al. | |
| 2006/0222794 A1 | 10/2006 | Hoshi et al. | |
| 2008/0138597 A1 | 6/2008 | Asai | |
| 2009/0209670 A1 | 8/2009 | Kanae et al. | |
| 2009/0297739 A1 | 12/2009 | Baily et al. | |
| 2009/0311472 A1 | 12/2009 | McGee et al. | |
| 2010/0021765 A1 | 1/2010 | Negandhi et al. | |
| 2010/0093913 A1* | 4/2010 | Jones et al. | 524/501 |
| 2011/0008561 A1 | 1/2011 | Kawauchi et al. | |
| 2012/0003429 A1 | 1/2012 | Iwasaki et al. | |
| 2013/0189496 A1 | 7/2013 | Fujiwara et al. | |
| 2013/0209742 A1 | 8/2013 | Fujiwara et al. | |

FOREIGN PATENT DOCUMENTS

| | | |
|---|---|---|
| CN | 1533402 A | 9/2004 |
| CN | 1839075 A | 9/2006 |
| CN | 101115617 A | 1/2008 |
| CN | 101186741 A | 5/2008 |
| CN | 101331179 A | 12/2008 |

(Continued)

OTHER PUBLICATIONS

Jan. 4, 2015 Office Action issued in Chinese Patent Application No. 201180048564.7.
Feb. 26, 2015 Office Action issued in U.S. Appl. No. 13/877,742.
Dec. 20, 2011 International Search Report issued in International Patent Application No. PCT/JP2011/073125.
Apr. 10, 2014 Office Action issued in U.S. Appl. No. 13/877,707.
Jul. 16, 2015 Office Action issued in U.S. Appl. No. 13/877,742.
Dec. 4, 2014 Office Action issued in Chinese Application No. 201180048577.4.
U.S. Appl. No. 13/877,707 in the name of Fujiwara et al. filed Apr. 4, 2013.
U.S. Appl. No. 13/877,742 in the name of Fujiwara et al. filed Apr. 4, 2013.

(Continued)

*Primary Examiner* — Elizabeth A Robinson
*Assistant Examiner* — Daniel D Lowrey
(74) *Attorney, Agent, or Firm* — Oliff PLC

(57) ABSTRACT

Disclosed is an electronic component packaging sheet including a surface conductive layer formed on the surface of at least one side of a substrate sheet. The substrate sheet includes (A) 80,000 to 220,000 Mw of a styrene-conjugated diene block copolymer; (B) 200,000 to 400,000 Mw of a polystyrene resin; and (C) 150,000 to 210,000 Mw of an impact resistant polystyrene resin. The surface conductive layer includes (D) an acrylic copolymer resin; and (E) a polythiophene type polymer, particularly a polythiophene type polymer/anionic polymer ion complex. The electronic component packaging sheet is a transparent conductive sheet having excellent thermoforming properties, good transparency after thermoforming, and sufficient electrostatic diffusion performance to maintain a low surface resistance value. The electronic component packaging sheet is particularly suited for the manufacture of embossed carrier tape.

10 Claims, 1 Drawing Sheet

(56) References Cited

FOREIGN PATENT DOCUMENTS

| JP | A-9-76424 | 3/1997 |
|---|---|---|
| JP | A-2002-47387 | 2/2002 |
| JP | A-2002-332392 | 11/2002 |
| JP | A-2003-55526 | 2/2003 |
| JP | A-2003-253069 | 9/2003 |
| JP | A-2003-308733 | 10/2003 |
| JP | A-2003-320605 | 11/2003 |
| JP | A-2005-23268 | 1/2005 |
| JP | A-2005-511808 | 4/2005 |
| JP | A-2006-27266 | 2/2006 |
| JP | A-2006-232914 | 9/2006 |
| JP | A-2007-157440 | 6/2007 |
| JP | A-2010-77294 | 4/2010 |
| JP | A-2010-174166 | 8/2010 |
| WO | WO 03/048227 A1 | 6/2003 |
| WO | WO 2009/081963 A1 | 7/2009 |
| WO | WO 2010/104010 A1 | 9/2010 |

OTHER PUBLICATIONS

Apr. 30, 2014 Chinese Office Action issued in Chinese Application No. 201180048564.7 with partial English-language translation.
International Search Report issued in International Patent Application No. PCT/JP2011/073112 dated Dec. 20, 2011.
Aug. 7, 2014 Office Action issued in U.S. Appl. No. 13/877,707.
Apr. 18, 2014 Office Action issued in Chinese Patent Application No. 201180048 (with partial translation).
Dec. 20, 2011 International Search Report issued in International Patent Application No. PCT/JP2011/073105.
May 21, 2014 Search Report issued in Chinese Patent Application No. 201180048578.9 (with translation).

* cited by examiner

[FIG. 1]
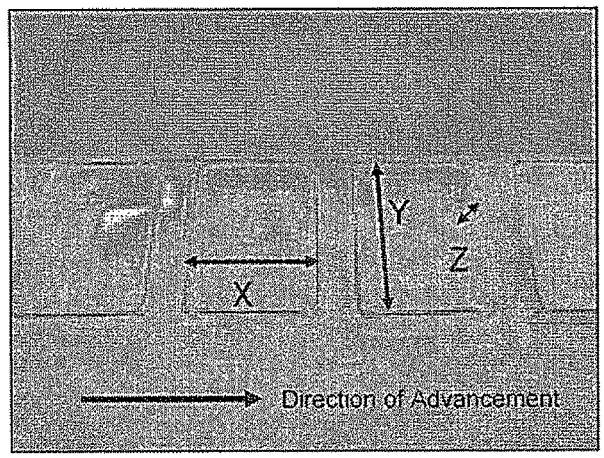
[FIG. 2]
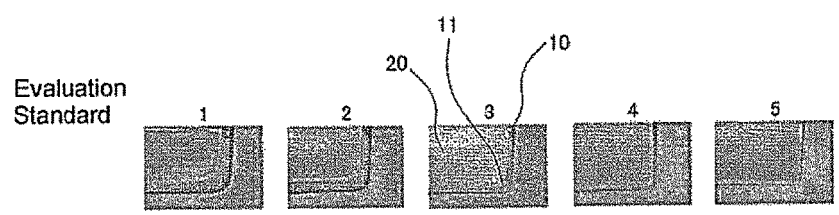
[FIG. 3]
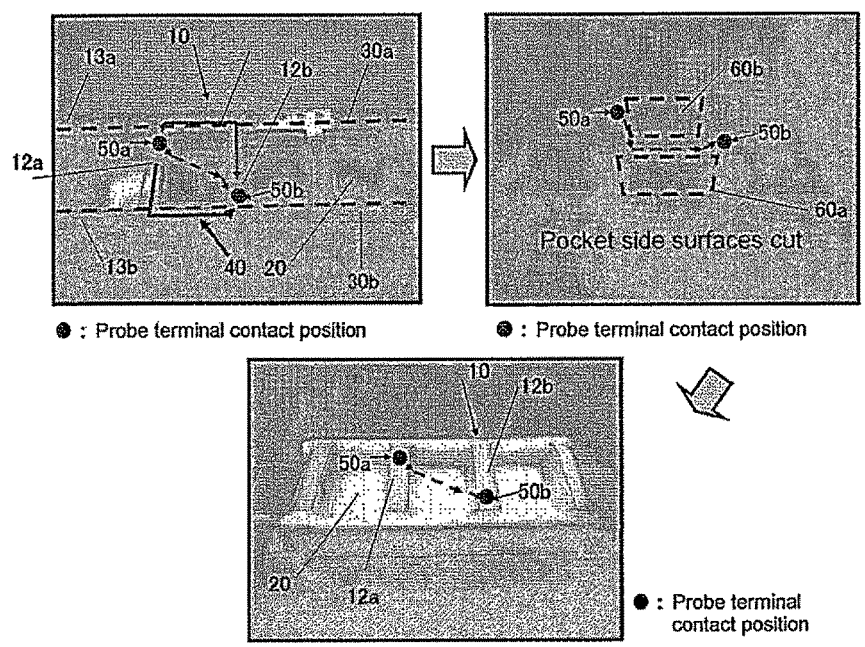

ELECTRONIC COMPONENT PACKAGING SHEET, AND FORMED ARTICLE THEREOF

TECHNICAL FIELD

The present invention relates to a sheet for packaging electronic components such as IC's, LED's, connectors and capacitors, a method for production thereof, and a formed article formed from said sheet.

BACKGROUND ART

Generally, carrier tapes are used to store and transport compact electronic components such as IC's. In particular, polystyrene (PS) sheets are excellent in transparency and have good thermoforming properties, so they are widely used for being able to provide carrier tapes of good pocket shape (see, e.g., Patent Documents 1 and 2).

On the other hand, when transporting IC's, the buildup of static electricity due to friction between the carrier tape and the content, or generated when peeling cover tape adhered to the top surface of the carrier tape, can result in destruction of the IC circuits. Additionally, in the case of very small components, the components can adhere to the cover tape, causing problems when mounting them to electronic devices. In order to prevent such trouble, the surface of the carrier tape is often subjected to an anti-static treatment (see, e.g., Patent Documents 3 and 4). However, when treated with a normal anti-static agent, the surface resistance can become higher, and the anti-static effect can be insufficient. Therefore, methods of preventing the buildup of static electricity by providing a conductive layer comprising a conductive material such as carbon black or a metallic powder are known (e.g., Patent Document 5), but in that case, it is difficult to obtain sufficient transparency to read letters inscribed on the compact electronic components that are contained inside through the tape or to inspect the products as to whether or not they are acceptable.

Additionally, as anti-static treatments and conductivity treatments for the surface of films in general, processes of coating the surface of a substrate film consisting of polycarbonate (PC), polyethylene terephthalate (PET), polypropylene (PP) or the like and forming a conductive layer having a certain degree of transparency have been proposed for various applications (see, e.g., Patent Documents 6 to 8).

However, sheets and films coated with various types of conductive agents and conductive compositions on their surfaces as disclosed in Patent Documents 6 to 8 are such that the materials of the substrate films are mainly composed of PC, PET and PP substrates, and no specific examples have been disclosed in the technical field of the present invention of a favorable arrangement wherein the surface of a PS sheet is coated. Additionally, when forming pockets in carrier tape using a sheet having the surface of the substrate sheet of the material coated with a conductive agent, the surface resistance of the conductive layer can rise, reducing the effect of preventing the buildup of electrostatic charge. Furthermore, when a raw sheet is stored in a wound state, particularly in a high-temperature high-humidity environment, blocking and separation of the conductive layer due to blocking may occur.

Furthermore, Patent Document 9 discloses a laminated sheet comprising a conductive coating layer containing a polythiophene type polymer formed on the substrate sheet. However, the degree of contact between the conductive coating layer and the substrate sheet is still inadequate in this laminated sheet, and there is a risk of the conductive film layer separating from the substrate sheet.

Patent Document 1: JP 2003-55526 A
Patent Document 2: JP 2005-23268 A
Patent Document 3: JP 2003-253069 A
Patent Document 4: JP 2003-320605 A
Patent Document 5: JP H9-76424 A
Patent Document 6: IP 2003-308733 A
Patent Document 7: JP 2005-511808 T
Patent Document 8: JP 2007-157440 A
Patent Document 9: JP 2006-27266 A

SUMMARY OF THE INVENTION

The present invention was achieved in view of the above-described circumstances, and has the primary purpose of offering an electronic component packaging sheet capable of retaining good thermoforming ability due to use of a polystyrene (PS) type substrate sheet, wherein the transparency does not deteriorate after forming even when providing a surface conductive layer, and the surface resistance can be maintained at a satisfactory level.

Additionally, the present invention has another purpose of offering an electronic component packaging sheet with almost no blocking of sheets and almost no separation of the conductive layer due to blocking.

Furthermore, the present invention also has the purpose of offering a method suitable for producing the aforementioned electronic component packaging sheet and a formed article produced using the aforementioned electronic component packaging sheet.

The antistatic effect is achieved in a carrier tape having a conductive layer on the surface by dispersing static electricity, generated by friction with the contents during transport or the like as described above, through a conductive layer with sufficiently low surface resistance. Therefore, the present inventors performed diligent research into compositions wherein the surface resistance measured at standard intervals is held to a standard level or less and the transparency is retained even after pocket formation, whereupon they discovered that an electronic component packaging sheet capable of solving these problems, and with almost no blocking of the sheet resulting in separation of the conductive layer, can be obtained by applying a coating comprising a polythiophene type polymer to a substrate sheet using a polystyrene (PS) type resin composition, wherein each resin has a molecular weight in a specific range.

In other words, according to a first aspect, the present invention offers an electronic component packaging sheet having a surface conductive layer formed on a surface on at least one side of a substrate sheet, wherein the substrate sheet comprises a styrene-conjugated diene block copolymer (A), a polystyrene resin (B), and a high impact polystyrene resin (C), the components having the following weight-average molecular weights (Mw):

component (A): Mw=80,000 to 220,000;
component (13): Mw 200,000 to 400,000;
component (C): Mw 150,000 to 210,000; and
the surface conductive layer comprising an acrylic copolymer resin (D) and a polythiophene type polymer.

Regarding the above, according to one embodiment, the peak molecular weight by GPC of polymer blocks of styrenic monomers in component (A) is in the range of 30,000 to 120,000; and a half-width of a molecular weight distribution curve of the polymer blocks of the styrenic monomers is in the range of 0.8 to 1.25. The rubber component in a graft rubber in component (C) is preferably a diene rubber monomer chosen from the group consisting of 1,3-butadiene (butadiene), 2-methyl-1,3-butadiene (isoprene), 2,3-dimethyl-1,3-butadiene, 1,3-pentadiene, 1,3-hexadiene and 2-methylpentadiene, or a thermoplastic elastomer of a styrene-conjugated diene block copolymer wherein the diene component is at least 50 mass %. In one example, the particle size of the graft rubber in component (C) is φ 2.0 to 3.0 μm, and the proportion of rubber in the graft rubber in the substrate sheet is 0.75 to 1.90 mass %.

In another embodiment, the substrate sheet is formed of a resin composition comprising 29 to 65 mass % component (A), 51 to 15 mass % component (B) and 20 to 9 mass % component (C), and the melt tension of the substrate sheet at 220° C. is 10 to 30 mN.

In yet another embodiment of the present invention, the surface conductive layer comprises, as a polythiophene type polymer, an ion complex (E) of a polythiophene type polymer and an anionic polymer. In such an embodiment, the surface conductive layer preferably comprises 10 to 45 mass % of the ion complex (E) of a polythiophene type polymer and an anionic polymer; and 55 to 90 mass % of the acrylic copolymer resin (D).

The particle size in a dispersion of the acrylic copolymer resin (D) in the surface conductive layer is 80 to 350 nm and the glass transition temperature $T_g$ of the acrylic copolymer resin (D) in the surface conductive layer is 25 to 80° C. Additionally, in a preferred embodiment, the surface resistance of a formed article with a draw ratio for thermoforming of 1.5 to 3 times is on the order of $10^5 \Omega$ to $10^7 \Omega$. Additionally, the coefficient of static friction of the conductive layer formed on the surface of the substrate sheet is preferably at least 0.85 and at most 2.50, and the coefficient of kinetic friction is preferably at least 0.85 and at most 2.50.

In another embodiment, the present invention offers a method for producing the aforementioned electronic component packaging sheet, comprising a step of applying a dispersion mixing an aqueous dispersion of the ion complex (E) and an aqueous dispersion of the acrylic copolymer resin (D) to a surface on at least one side of the substrate sheet.

In yet another embodiment, the present invention offers a formed article formed by thermoforming the aforementioned electronic component packaging sheet, and this formed article may, for example, be an embossed carrier tape.

According to the present invention, by using a polystyrene (PS) type substrate sheet, it is possible to obtain an electronic component packaging sheet that maintains good thermoforming properties, wherein the transparency after forming does not deteriorate even when providing a surface conductive layer, and the surface resistance can be retained at a satisfactory level. Additionally, the sheet almost never undergoes blocking or separation of the conductive layer.

BRIEF DESCRIPTION OF THE DRAWINGS

FIG. 1 shows a formed article formed by thermoforming an electronic component packaging sheet in a pressure-forming machine according to an example of the present invention.

FIG. 2 shows standards for evaluation of thermoforming properties of an electronic component packaging sheet according to examples of the present invention.

FIG. 3 shows a method of measurement of surface resistance of a carrier tape formed article according to an example of the present invention.

MODES FOR CARRYING OUT THE INVENTION

Herebelow, modes for carrying out the present invention will be described in detail.

The electronic component packaging sheet according to an embodiment of the present invention has a surface conductive layer formed on the surface on at least one side of the substrate sheet. The substrate sheet is formed from a resin composition containing the respective components, i.e. a styrene-conjugated diene block copolymer (A), a polystyrene resin (B), and a high impact polystyrene resin (C), respectively having specific weight-average molecular weights, and the surface conductive layer comprises an acrylic copolymer resin (D), and a polythiophene polymer.

The styrene-conjugated diene block copolymer (A) is a polymer including, in its structure, polymer blocks mainly comprising styrenic monomers and polymer blocks mainly comprising conjugated diene monomers. Examples of styrenic monomers include styrene, o-methylstyrene, p-methylstyrene, p-tert-butylstyrene, 1,3-dimethylstyrene, α-methylstyrene, vinylnapththalene, vinylanthracene and 1,1-diphenylethylene. In a particularly preferred embodiment of the invention, the monomers are mainly styrene, but one or more other components may be included as trace components.

Conjugated diene monomers are compounds having conjugated double bonds in their structure. Examples include 1,3-butadiene (butadiene), 2-methyl-1,3-butadiene (isoprene), 2,3-dimethyl-1,3-butadiene, 1,3-pentadiene, 1,3-hexadiene and 2-methylpentadiene, among which butadiene and isoprene are preferred. One or more types of conjugated diene monomers may be used. The polymer blocks mainly comprising styrenic monomers refer to both polymer blocks consisting of only structures derived from styrenic monomers and polymer blocks comprising structures derived from styrenic monomers in an amount of at least 50 mass %. The polymer blocks mainly comprising conjugated diene monomers refer to both polymer blocks consisting of only structures derived from conjugated diene monomers and polymer blocks comprising structures derived from conjugated diene monomers in an amount of at least 50 mass %. The conjugated diene content in the styrene-conjugated diene block copolymer (A), for every 100 parts by mass of component (A), should preferably be 10 to 25 mass % in view of the mechanical properties of the substrate sheet. Here, the conjugated diene content refers to the proportional mass of structures derived from conjugated diene monomers in the entire copolymer.

One or more types of the styrene-conjugated diene block copolymer (A) may be used. In the present invention, when the conjugated diene is butadiene, for example, the styrene-conjugated diene block copolymer may be either a styrene-butadiene (SB) bipolymer or a styrene-butadiene-styrene (SBS) terpolymer, and may be a resin composed of a plurality of blocks, with three or more styrene blocks and two or more butadiene blocks. Furthermore, it may have a so-called tapered block structure wherein the component ratio of styrene and butadiene blocks continuously changes between respective blocks. Additionally, the styrene-conjugated diene block copolymer may be one that is commercially available used as is.

In the styrene-conjugated diene block copolymer (A) used in the present invention, the polymer blocks of styrenic monomers in the component preferably have a peak molecular weight as measured by GPC in the range of 30,000 to 120,000, and the molecular weight distribution curve of the styrene monomer blocks preferably has a half-width in the range of 0.8 to 1.25, more preferably 1.05 to 1.25. Use of those in this range enables good formability to be achieved. The molecular weight distribution curve of the styrene blocks in component (A) can be determined by the following method. First, component (A) is subjected to oxidative degradation by chloroform using osmium tetroxide as a catalyst, in accordance with the method described in I. M. Kolthoff, et al., *J. Poly. Sci.*, 1, 429 (1946), then the resulting styrene blocks are dissolved in a tetrahydrofuran solvent and measured by GPC. The molecular weight curve can then be used to determine the styrene-converted peak molecular weight using standard polystyrene (monodisperse). The GPC measurements may be in accordance with conventional techniques, with the main measurement conditions being as follows:

Column temperature: 40° C.
Detection method: differential refractometry
Mobile phase: tetrahydrofuran
Sample concentration: 2 mass %
Calibration curve: from standard polystyrene (monodisperse)

The half-width can be determined using this molecular weight distribution curve for the styrene blocks. Specifically, when the molecular weight is placed on the horizontal axis using a logarithmic scale with the range of 1000 to 1,000,000 being 15 cm, and the concentration (weight ratio) is placed on the vertical axis at an arbitrary height, the width of the peak on the horizontal axis at a height of 50% of the peak top is the half-width. In this case, the height of the peak top should be that perpendicular to the horizontal axis, and the width of the peak at 50% of the height should be parallel to the horizontal axis. The half-width of the molecular weight distribution curve of the styrene blocks correlates with the molecular weight distribution of the block copolymer. While the method of adjusting the molecular weight distribution is not particularly restricted, block copolymers of different molecular weights can be obtained by methods such as adjusting the time of addition of the initiator during the polymerization of styrene block parts in component (A).

The polystyrene resin is a resin (3) generally known as a GPPS, mainly comprising styrene monomers, but may contain one or more aromatic vinyl compounds such as o-methylstyrene, p-methylstyrene, p-tert-butylstyrene, 1,3-dimethylstyrene, α-methylstyrene, vinylnaphthalene, vinylanthracene and 1,1-diphenylethylene as a trace component, and a commercially available resin may be used.

The high impact polystyrene resin (C) in the present invention is a resin generally known as a HIPS, and is a polystyrene resin comprising microparticulate graft rubber to which styrenic monomers have been grafted. Graft rubber is a type of rubber wherein styrenic monomers have been graft-copolymerized to a rubber component as described below to form graft branches. The graft rubber content in component (C) can be determined by dissolving in a mixed solvent of MEK and acetone at a mass ratio of 50/50, recovering the undissolved portion by centrifugation, and calculating from the mass thereof. Examples of the rubber components in the graft rubber include, for example, diene rubbers with 1,3-butadiene (butadiene), 2-methyl-1,3-butadiene (isoprene), 2,3-dimethyl-1,3-butadiene, 1,3-pentadiene, 1,3-hexadiene and 2-methylpentadiene as monomers. Additionally, a thermoplastic elastomer which is a styrene-conjugated diene block copolymer wherein the diene component takes up at least 50 mass % may be used. Among these, polybutadiene and styrene-butadiene block copolymers are preferred.

With the graft rubber in component (C), having a particle size in the range of at least ϕ 2.0 μm and at most ϕ 3.0 μm, preferably at least ϕ 2.3 μm and at most ϕ 2.7 μm, the substrate sheet excels in transparency and strength properties. The graft rubber particle size here refers to the average particle size of the graft rubber component measured by a laser diffraction type particle analyzer. Additionally, in the substrate sheet of the present invention, the graft rubber content derived from component (C) in the substrate sheet when the substrate sheet is defined as 100 mass % should be 0.75 to 1.90 mass % in order to achieve balance between impact resistance and transparency of the substrate sheet. The graft rubber content in component (C) and the proportional content of component (C) in the substrate sheet should be adjusted to put the graft rubber content of the sheet in the above-indicated ranges.

The substrate sheet of the present invention is formed of a resin composition containing 29 to 65 parts by mass of component (A), 51 to 15 parts by mass of component (B), and 20 to 9 parts by mass of component (C), with (A) to (C) totaling 100 parts by mass. By setting the composition in these ranges, a substrate sheet that is satisfactory in strength properties, impact resistance and transparency can be obtained.

The substrate sheet for an electronic component packaging sheet according to one embodiment of the present invention is preferably a resin wherein the weight-average molecular weights (Mw) of the respective components (A) to (C) are in the following ranges:

Component (A): Mw=80,000 to 220,000
Component (B): Mw=200,000 to 400,000
Component (C): Mw=150,000 to 210,000

Here, the weight-average molecular weight (Mw) can be determined from a standard polystyrene-converted molecular weight distribution curve determined by conventional methods using GPC.

By using resins in such ranges of weight-average molecular weight, not only does it become possible to adjust the appropriate range of melt tension for this resin composition as described below, but also a sheet with a good balance of strength properties and transparency can be obtained, with very good formability when thermoforming the resulting substrate sheets into carrier tape or the like, enabling good pocket formation even for deep draw forming.

Here, the melt tension is a value (mN) measured using a melt tension measuring apparatus with an orifice diameter of 1.0 mm ϕ, and orifice length of 10 mm and winding speeds of 10, 30 and 50 m/min. By using components (A) to (C) with weight-average molecular weights in the above-described ranges, and adjusting the blending ratio of the components (A) to (C) as needed, the melt tension at 220° C. of the resulting resin composition can be adjusted, preferably to the range of 10 to 30 mN. When the melt tension is in this range, a substrate sheet with particularly good forming properties can be obtained when thermoforming the substrate sheet to obtain a container. When the melt tension is less than 10 mN, holes may form when thermoforming the substrate sheet, and when exceeding 30 mN, the formativeness (sharpness) of the pockets of the formed articles may be deficient.

The method of producing the substrate sheet of the present invention using the resin composition comprising the above components (A) to (C) is not particularly limited and the sheet may be produced by a common method. For example, the components (A) to (C) can be blended in a predetermined ratio and mixed using a commonly used mixer such as a tumbler, then kneaded in an extruder to form pellet-shaped compounds. These pellet-shaped compounds can then be extruded using a ϕ 65 mm extruder with a T-die to produce substrate sheets. Additionally, so-called "ear" portions formed during the substrate sheet extrusion process can be pulverized and returned to the substrate sheet within a range not greatly affecting the strength of the substrate sheet and the formed article after forming.

While the thickness of the substrate sheet is not particularly limited, when considering the application, it should be from 50 μm to 3 mm, preferably 100 μm to 1 mm, and more preferably 150 to 600 μm.

The surface conductive layer formed on at least one surface of the substrate sheet comprises a polythiophene type polymer and an acrylic copolymer resin.

The polythiophene of the present invention is a polythiophene type polymer having a thiophene backbone, and is usually poly(thiophene-2,5-diyl). The thiophene may be a substitution (normally a substitution at position 3 and/or 4), and the substituted thiophene may, for example, be mono-alkylthiophene, 3,4-dihydroxythiophene, dialkoxythiophene, alkylene dioxythiophene, cycloalkylene dioxythiophene or the like. Specific examples of polythiophene type polymers include polythiophene, poly(3-hexylthiophene), poly(3,4-ethylenedioxythiophene), poly(3,4-propylene dioxythiophene), poly[3,4-(1,2-cyclohexylene)dioxythiophene] and polythienylene vinylene. Additionally, the polythiophene polymer may be a copolymer comprising such thiophene units and vinylene units.

The aforementioned polythiophene type polymer, in one embodiment, is oxidation polymerized in the presence of an anionic polymer during the polymerization step, so the polythiophene type polymer may be used in the surface conductive layer of the present invention, particularly as an ion complex (E) with an anionic polymer.

Examples of such anionic polymers include polymers comprising at least one anionic group chosen from among carboxyl groups and sulfonic acid groups or a salt thereof, for example, a polymer comprising a carboxyl group or a salt thereof, a polymer comprising a sulfonic acid group or a salt thereof (e.g., polystyrene sulfonic acid, polyvinyl sulfonic acid, etc.), a polymer comprising a carboxyl group and a sulfonic acid group or a salt thereof (e.g., a (meth) acrylic acid-styrene sulfonic acid copolymer). Examples of salts of anionic polymers include alkali metal salts such as sodium salts and potassium salts, ammonium salts, alkylamines such as triethylamine, and organic amine salts such as alkanolamine. These anionic polymers can be used singly or in combinations of two or more types. Of these anionic polymers, polymers having a sulfonic acid group, such as polystyrene sulfonic acid, are preferred. The proportion of the anionic polymer should preferably be, for example, 100 to 300 parts by mass with respect to 100 parts by mass of the polythiophene type polymer.

Furthermore, the surface conductive layer of the present invention preferably comprises an acrylic copolymer resin (D) in addition to the ion complex (E) of a polythiophene type polymer and an anionic polymer. By comprising an acrylic copolymer (D), the level of contact between the surface conductive layer and the substrate sheet significantly increases, so that when the sheet is thermoformed to form a packaging container for electronic components such as a carrier tape, not only will the surface conductive layer not separate from the substrate sheet, but decreases in conductivity due to thermoforming can be significantly suppressed. The proportional content of component (E) and component (D) in the surface conductive layer is preferably in the range of 10 to 45 mass % component (E) and 55 to 90 mass % component (D). Additionally, the glass transition temperature Tg of the acrylic copolymer resin should preferably be 25 to 80° C. in order to adequately retain the conductivity after thermoforming the sheet of the present invention. Additionally, the acrylic copolymer resin should preferably have a particle size (the average particle size here is the median diameter value) of 80 to 350 nm, more preferably 100 to 250 nm. By using those with a particle size in the range of 80 to 350 nm, the coefficient of static friction and the coefficient of kinetic friction can be adjusted to at least 0.85 and at most 2.50. While the transparency after coating could be increased by using an acrylic copolymer resin with a particle size of less than 80 nm, there is a risk of the coefficient of static friction and the coefficient of kinetic friction becoming less than 0.85, resulting in blocking and separation of the conductive layer due to blocking. On the other hand, the coefficient of static friction and the coefficient of kinetic friction could be raised by setting the particle size of the acrylic copolymer resin to at least 350 nm, but that may reduce the transparency and make it insufficient.

In the present invention, the surface conductive layer is formed on at least one surface of the substrate sheet. In order to form a surface conductive layer on the surface of the substrate sheet, the aforementioned polythiophene type polymer, preferably an ion complex (E) of a polythiophene type polymer and an anionic polymer, can be combined with an aqueous solvent to form an aqueous dispersion, an acrylic copolymer resin (D) combined with an aqueous solvent to form an aqueous dispersion, and these dispersions applied separately to the surface of the substrate sheet, but it is convenient and preferable to mix the aforementioned aqueous dispersion of a polythiophene type polymer, preferably component (E), with the aforementioned aqueous dispersion of an acrylic copolymer resin (D) to prepare a coating agent, and to apply this coating to the surface of the substrate sheet.

Here, the concentration of the polythiophene type polymer in the aqueous dispersion may, for example, be in the range of 0.1 to 5 weight %, and the concentration of the acrylic resin in the aqueous dispersion may, for example, be in the range of 15 to 35 weight %.

Additionally, the aqueous solvent used here may be just water, or a mixed solvent of water and a hydrophilic solvent (especially a water-miscible solvent), for example, an alcohol (methanol, ethanol, propanol, isopropanol, isobutanol, ethylene glycol, propylene glycol, etc.). The hydrophilic solvent may be used singly or as a combination of two or more types, as long as the mixed substances do not aggregate mutually or by themselves. In a preferred embodiment of the present invention, the solvent is normally water alone or a mixed solvent of water and an alcohol. Additionally, the dispersion may comprise an anionic, cationic, non-ionic or amphoteric surfactant, either singly or as a combination of two or more types. Aside therefrom, various additives such as various types of stabilizers, fillers, crosslinking agents, coupling agents and flame retardants may be included. These additives are contained in the formed surface conductive layer.

The coating solution for the surface conductive layer may be applied by commonly used application means, for example, by spray, roll coater, gravure roll coater, knife coater or dip coater. If necessary, the coating of the surface conductive layer may be applied multiple times. The surface conductive layer may be formed by applying the coating of the surface conductive layer to the substrate sheet, then drying.

The amount of coating applied, in terms of the weight after drying, may for example be 2000 to 4500 mg/m$^2$.

The sheet of the present invention obtained by the aforementioned method is a laminated sheet having a high level of contact and anti-static properties, as well as high transparency. The total light transmittance (JIS K 7150) of the sheet is, for example, about 75% to 95%, preferably 85% to 95%. Additionally, the haze (JIS K 7150) of this laminated sheet is, for example, about 2% to 20%, preferably 2% to 10%.

The resulting sheet will normally be wound into a roll and will often be subjected to post-processing. By winding in this way, stickiness and whitening can be suppressed, and the laminated sheet will not lose transparency and gloss.

The sheet obtained as described above excels in formability, and can therefore be easily secondarily formed by common thermoforming methods such as pressure forming (extrusion pressure forming, hot-plate pressure forming, vacuum pressure forming, etc.), vacuum forming, matched mold forming and hot-plate forming.

The sheet of the present invention excels in anti-static properties, formability and various mechanical properties, and is therefore suitable for use, as secondary formed articles, in formed articles for packaging miniature electronic components, especially carrier tapes such as embossed carrier tapes, formed articles for packaging electronic components, and formed articles for packaging large electronic components, such as trays for housing liquid crystal panels. By using the sheet of the present invention for a formed article for packaging large electronic components, it is possible to achieve effective anti-static properties even with respect to debris generated at a cut section when trimming a formed article or in subsequent steps, and wear debris generated by vibration of electronic components and the like.

EXAMPLES

Herebelow, Examples 1 to 19 and Comparative Example 1 to 7 of the sheet for packaging electronic components of the present invention shall be explained with reference to Tables 1 to 5 and FIGS. 1 to 3.

Table 1-1 to Table 1-3 show the specifications for each component (A), (B) and (C) in the resin composition of the substrate sheet used in the examples and comparative examples.

Table 1-1 shows the weight-average molecular weight (Mw), butadiene/styrene mass % ratio, styrene block peak molecular weight and styrene block peak half-width of the compositions of the styrene-conjugated diene block copolymer (A). Table 1-2 shows the weight-average molecular weight (Mw) of the compositions of the polystyrene resin (B).

Table 1-3 shows the weight-average molecular weight (Mw), graft rubber part (mass %) and graft rubber average particle size (μm) of the compositions of the high impact polystyrene resin (C).

TABLE 1-1

| | | Weight Average Molecular Weight (Mw) | Butadiene/ Styrene (Mass %) | Styrene Block Peak Molecular Weight | Styrene Block Peak Half-width (cm) |
|---|---|---|---|---|---|
| Styrene- Conjugated Diene Copolymer (A) | A-1 | 150,000 | 20/80 | 40,000 | 1.11 |
| | A-2 | 140,000 | 24/76 | 109,000 | 0.94 |
| | A-3 | 80,000 | 16/84 | 34,000 | 0.98 |
| | A-4 | 220,000 | 17/83 | 77,000 | 1.09 |
| | A-5 | 280,000 | 18/82 | 140,000 | 0.70 |
| | A-6 | 70,000 | 40/60 | 15,000 | 1.30 |

TABLE 1-2

| | | Weight Average Molecular Weight (Mw) |
|---|---|---|
| Polystyrene (B) | B-1 | 330,000 |
| | B-2 | 290,000 |
| | B-3 | 210,000 |
| | B-4 | 370,000 |
| | B-5 | 470,000 |
| | B-6 | 120,000 |

TABLE 1-3

| | | Weight Average Molecular Weight (Mw) | Graft Rubber Part (mass %) | Graft Rubber Average Particle Size (μm) |
|---|---|---|---|---|
| High-Impact Polystyrene (C) | C-1 | 180,000 | 8.6 | 2.5 |
| | C-2 | 190,000 | 7.9 | 2.0 |
| | C-3 | 150,000 | 8.8 | 2.3 |
| | C-4 | 200,000 | 7.4 | 2.3 |
| | C-5 | 100,000 | 6.1 | 1.8 |
| | C-6 | 250,000 | 7.3 | 2.8 |

Table 2 shows the compositions (mass %) of methyl methacrylate, butyl acrylate, butyl methacrylate and cyclohexyl methacrylate in the acrylic copolymer resin (D) used in the examples and comparative examples, as well as the glass transition point (° C.) and average particle size (nm) of the resins.

TABLE 2

| | | Composition in Resin (mass %) | | | | Glass | Average |
|---|---|---|---|---|---|---|---|
| | No | Methyl Methacrylate | Butyl Acrylate | Butyl Methacrylate | Cyclohexyl Methacrylate | Transition Point (° C.) | Particle Size (nm) |
| Acrylic Copolymer Resin (D) | D-1 | 40 | 41 | 8 | 11 | 40 | 130 |
| | D-2 | 73 | 8 | 8 | 11 | 75 | 210 |
| | D-3 | 81 | 4 | 4 | 11 | 80 | 870 |

TABLE 2-continued

| No | Composition in Resin (mass %) | | | | Glass Transition Point (° C.) | Average Particle Size (nm) |
| | Methyl Methacrylate | Butyl Acrylate | Butyl Methacrylate | Cyclohexyl Methacrylate | | |
|---|---|---|---|---|---|---|
| D-4 | 75 | 7 | 7 | 11 | 85 | 230 |
| D-5 | 40 | 35 | 14 | 11 | 50 | 70 |

Table 3-1 and Table 3-2 show the component ratios by mass % of the styrene-conjugated diene block copolymer component (A) shown in Table 1-1, polystyrene resin component (B) shown in Table 1-2 and high impact polystyrene resin component (C) shown in Table 1-3, the graft rubber content in the substrate sheet, and the melt tension at winding speeds of 10, 30 and 50 m/min for the substrate sheets used in Examples 1 to 19 and Comparative Examples 1 to 7. The method for measuring the melt tension will be described below.

TABLE 3-1

| | Styrene-Conjugated Diene Block Copolymer (A) | | | | | | Polystyrene (B) | | | | | | High Impact Polystyrene (C) | | | | | | Graft Rubber Content (mass %) |
| | A-1 | A-2 | A-3 | A-4 | A-5 | A-6 | B-1 | B-2 | B-3 | B-4 | B-5 | B-6 | C-1 | C-2 | C-3 | C-4 | C-5 | C-6 | |
|---|---|---|---|---|---|---|---|---|---|---|---|---|---|---|---|---|---|---|---|
| Example 1 | 58 | | | | | | 33 | | | | | | 9 | | | | | | 0.77 |
| Example 2 | | 55 | | | | | | | 25 | | | | | | 20 | | | | 1.58 |
| Example 3 | | | 58 | | | | 33 | | | | | | 9 | | | | | | 0.77 |
| Example 4 | | | | 58 | | | 33 | | | | | | 9 | | | | | | 0.77 |
| Example 5 | 58 | | | | | | | | | | 33 | | 9 | | | | | | 0.77 |
| Example 6 | 58 | | | | | | | | | | | 33 | | | | 9 | | | 0.66 |
| Example 7 | 58 | | | | | | 33 | | | | | | | | 9 | | | | 0.79 |
| Example 8 | 40 | | | | | | 51 | | | | | | 9 | | | | | | 0.77 |
| Example 9 | 35 | | | | | | 45 | | | | | | | | 20 | | | | 1.72 |
| Example 10 | 58 | | | | | | 33 | | | | | | 9 | | | | | | 0.77 |
| Example 11 | 58 | | | | | | 33 | | | | | | 9 | | | | | | 0.77 |
| Example 12 | 58 | | | | | | 33 | | | | | | 9 | | | | | | 0.77 |
| Example 13 | 58 | | | | | | 33 | | | | | | 9 | | | | | | 0.77 |
| Example 14 | 58 | | | | | | 33 | | | | | | 9 | | | | | | 0.77 |
| Example 15 | 58 | | | | | | 33 | | | | | | 9 | | | | | | 0.77 |
| Example 16 | 58 | | | | | | 33 | | | | | | 9 | | | | | | 0.77 |
| Example 17 | 58 | | | | | | 33 | | | | | | 9 | | | | | | 0.77 |
| Example 18 | 58 | | | | | | 33 | | | | | | 9 | | | | | | 0.77 |
| Example 19 | 58 | | | | | | 33 | | | | | | 9 | | | | | | 0.77 |
| Comp. Example 1 | 58 | | | | | | 33 | | | | | | 9 | | | | | | 0.77 |
| Comp. Example 2 | 58 | | | | | | 33 | | | | | | 9 | | | | | | 0.77 |
| Comp. Example 3 | | | | | 58 | | | | | 33 | | | | | | | | 9 | 0.65 |
| Comp. Example 4 | | | | | | 58 | | | | | 33 | | | | | 9 | | | 0.54 |
| Comp. Example 5 | 100 | | | | | | | | | | | | | | | | | | 0.00 |
| Comp. Example 6 | 58 | | | | | | | | | | | | | | | | | 42 | 3.61 |
| Comp. Example 7 | 58 | | | | | | 33 | | | | | | 9 | | | | | | 0.77 |

TABLE 3-2

| | Melt Tension (10 m/min) mN | Melt Tension (30 m/min) mN | Melt Tension (50 m/min) mN |
|---|---|---|---|
| Example 1 | 18 | 20 | 21 |
| Example 2 | 15 | 17 | 18 |
| Example 3 | 14 | 15 | 16 |
| Example 4 | 19 | 21 | 22 |
| Example 5 | 19 | 20 | 22 |
| Example 6 | 19 | 20 | 21 |
| Example 7 | 17 | 18 | 19 |
| Example 8 | 26 | 30 | 31 |
| Example 9 | 22 | 26 | 27 |
| Example 10 | 18 | 20 | 21 |
| Example 11 | 18 | 20 | 21 |
| Example 12 | 18 | 20 | 21 |
| Example 13 | 18 | 20 | 21 |
| Example 14 | 18 | 20 | 21 |
| Example 15 | 18 | 20 | 21 |
| Example 16 | 18 | 20 | 21 |
| Example 17 | 18 | 20 | 21 |
| Example 18 | 18 | 20 | 21 |
| Example 19 | 18 | 20 | 21 |
| Comp. Example 1 | 18 | 20 | 21 |
| Comp. Example 2 | 18 | 20 | 21 |
| Comp. Example 3 | 31 | 33 | 34 |
| Comp. Example 4 | 8 | 10 | 11 |
| Comp. Example 5 | 10 | 11 | 13 |
| Comp. Example 6 | 14 | 15 | 15 |
| Comp. Example 7 | 18 | 20 | 21 |

Table 4 shows the component ratios by mass % of the acrylic copolymer resin (D) shown in Table 2 and ion complex (E) of a polythiophene type polymer and an anionic polymer (Agfa, Orgacon HBS5 solid part) in the surface conductive layer formed on the substrate sheets of Examples 1 to 19 and Comparative Examples 1 to 7. In Comparative Example 2, tin oxide with a particle size of φ 10 nm was used instead of the polythiophene type polymer. Additionally, in Comparative Example 7, an aqueous dispersion of a water-soluble epoxy resin (bisphenol A) was used as a binder instead of an aqueous dispersion of an acrylic copolymer resin.

after drying. The results of evaluation tests of a substrate sheet on which this surface conductive layer was formed are shown in Table 5.

Examples 2 to 19 and Comparative Examples 1 to 7

Substrate sheets having surface conductive layers formed thereon were obtained in the same manner as Example 1,

TABLE 4

|  | Acrylic Copolymer Resin (D) | | | | | Ion Complex of Polythiophene-type Polymer and Anionic Polymer (E) |
| --- | --- | --- | --- | --- | --- | --- |
|  | D-1 | D-2 | D-3 | D-4 | D-5 | E-1 |
| Example 1 | 67 | | | | | 33 |
| Example 2 | 67 | | | | | 33 |
| Example 3 | 67 | | | | | 33 |
| Example 4 | 67 | | | | | 33 |
| Example 5 | 67 | | | | | 33 |
| Example 6 | 67 | | | | | 33 |
| Example 7 | 67 | | | | | 33 |
| Example 8 | 67 | | | | | 33 |
| Example 9 | 67 | | | | | 33 |
| Example 10 | 52 | | | | | 48 |
| Example 11 | 85 | | | | | 15 |
| Example 12 | | 67 | | | | 33 |
| Example 13 | | 75 | | | | 25 |
| Example 14 | | | 67 | | | 33 |
| Example 15 | | | | 67 | | 33 |
| Example 16 | 75 | | | | | 25 |
| Example 17 | 60 | | | | | 40 |
| Example 18 | 67 | | | | | 33 |
| Example 19 | | | | | 67 | 33 |
| Comp. Example 1 | 100 | | | | | |
| Comp. Example 2 | 85 | | | | | 15 (tin oxide, particle size 10 nm) |
| Comp. Example 3 | 67 | | | | | 33 |
| Comp. Example 4 | 67 | | | | | 33 |
| Comp. Example 5 | 67 | | | | | 33 |
| Comp. Example 6 | 67 | | | | | 33 |
| Comp. Example 7 | | 67 Epoxy Binder | | | | 33 |

Example 1

As shown in Table 3-1, 58 parts by mass of the styrene-butadiene block copolymer (A) of A-1 in Table 1-1 (Mw: 150,000; butadiene content 20 mass %), 33 parts by mass of the polystyrene resin (B) of B-1 in Table 1-2 (Mw: 330,000) and 9 parts by mass of the high impact polystyrene resin (C) of C-1 in Table 1-3 (Mw: 180,000; rubber particle size 2.5 μm) were dry-blended and formed into a film by a φ 40 mm extruder (L/D=26) and 600 mm wide T-dice, resulting in a substrate sheet of thickness 250 μm. As shown in Table 4, an aqueous dispersion of an ion complex (E) of a polythiophene type polymer and an anionic polymer (AGFA, Orgacon HBS5), and an aqueous dispersion of an acrylic copolymer (D) of D-1 in Table 2 (glass transition point: 40° C.) were mixed to obtain a mixed dispersion wherein the mass ratio (D)/(E) between the acrylic copolymer (D) and the ion complex (E) (comprising a polythiophene type polymer) was 67/33 as shown in Table 4. Next, this mixed dispersion was coated onto the surface of the substrate sheet in a gravure coater using a gravure roll, then dried at 90° C. to form a surface conductive layer of average thickness 3 μm aside from the fact that as the resin components (A) to (C), resins chosen from A-1 to A-6 in Table 1-1, B-1 to B-6 in Table 1-2 and C-1 to C-6 in Table 1-3 were used and blended at the mass ratios shown in Table 3-1 to prepare the substrate sheet, and an aqueous dispersion of D-1 to D-5 shown in Table 2 and component (E) was prepared.

Of Comparative Examples 1 to 7, Comparative Example 1 does not contain a polythiophene type polymer. In Comparative Example 2, tin oxide of particle size φ 10 nm was used instead of a polythiophene type polymer. In Comparative Example 3, the polystyrene of B-5 shown in Table 1-2 (weight-average molecular weight Mw: 470,000) was used as component (B), and in Comparative Example 4, the high impact polystyrene of C-5 shown in Table 1-3 (weight-average molecular weight Mw: 100,000) was used as component (C). Comparative Example 5 did contained neither component (B) nor component (C), and Comparative Example 6 did not contain component (B). In Comparative Example 7, an aqueous dispersion of a water-soluble epoxy resin (bisphenol A) was used as a binder instead of the aqueous dispersion of an acrylic copolymer resin.

The evaluation results for the examples and comparative examples are shown together in Table 5.

TABLE 5

| | Formability | | Surface Resistance (Ω) | | Draw Ratio | Cond Crack Y/N | Total Light Trans (%) | | Haze (%) | | Buckle Str (N) | Coefficient Friction | | Blk Y/N | Surf Res after Blk Eval. (Ω) |
|---|---|---|---|---|---|---|---|---|---|---|---|---|---|---|---|
| | Ftiv | Hol | Sheet | Article | | | Sheet | Bottm | Sheet | Bottm | Article | Stat | Kin | | |
| Example 1 | 5 | N | <$1.0 \times 10^4$ | $5.6 \times 10^7$ | 2.8 | N | 90 | 92 | 28 | 8 | 20 | 1.54 | 1.43 | N | <$1.0 \times 10^4$ |
| Example 2 | 5 | N | <$1.0 \times 10^4$ | $6.5 \times 10^7$ | 2.8 | N | 87 | 90 | 32 | 13 | 18 | 1.54 | 1.43 | N | <$1.0 \times 10^4$ |
| Example 3 | 5 | N | <$1.0 \times 10^4$ | $3.5 \times 10^6$ | 1.8 | N | 90 | 91 | 28 | 10 | 27 | 1.54 | 1.43 | N | <$1.0 \times 10^4$ |
| Example 4 | 5 | N | <$1.0 \times 10^4$ | $3.4 \times 10^6$ | 1.8 | N | 90 | 91 | 28 | 10 | 32 | 1.54 | 1.43 | N | <$1.0 \times 10^4$ |
| Example 5 | 5 | N | <$1.0 \times 10^4$ | $4.6 \times 10^6$ | 1.8 | N | 90 | 91 | 28 | 10 | 32 | 1.54 | 1.43 | N | <$1.0 \times 10^4$ |
| Example 6 | 5 | N | <$1.0 \times 10^4$ | $5.3 \times 10^7$ | 2.8 | N | 90 | 92 | 27 | 9 | 20 | 1.54 | 1.43 | N | <$1.0 \times 10^4$ |
| Example 7 | 5 | N | <$1.0 \times 10^4$ | $5.5 \times 10^7$ | 2.8 | N | 91 | 92 | 28 | 10 | 19 | 1.54 | 1.43 | N | <$1.0 \times 10^4$ |
| Example 8 | 5 | N | <$1.0 \times 10^4$ | $6.3 \times 10^7$ | 2.8 | N | 90 | 91 | 28 | 8 | 24 | 1.54 | 1.43 | N | <$1.0 \times 10^4$ |
| Example 9 | 5 | N | <$1.0 \times 10^4$ | $6.5 \times 10^7$ | 2.8 | N | 87 | 89 | 33 | 14 | 22 | 1.54 | 1.43 | N | <$1.0 \times 10^4$ |
| Example 10 | 5 | N | <$1.0 \times 10^4$ | $7.8 \times 10^8$ | 2.8 | N | 89 | 90 | 33 | 13 | 20 | 1.36 | 1.21 | N | <$1.0 \times 10^4$ |
| Example 11 | 5 | N | $2.5 \times 10^4$ | $5.5 \times 10^6$ | 1.8 | N | 90 | 91 | 28 | 9 | 30 | 1.64 | 1.48 | N | $4.1 \times 10^4$ |
| Example 12 | 5 | N | <$1.0 \times 10^4$ | $5.9 \times 10^7$ | 1.8 | N | 90 | 92 | 28 | 8 | 20 | 1.59 | 1.40 | N | <$1.0 \times 10^4$ |
| Example 13 | 5 | N | <$1.0 \times 10^4$ | $5.1 \times 10^7$ | 2.8 | N | 90 | 92 | 28 | 8 | 20 | 1.61 | 1.48 | N | <$1.0 \times 10^4$ |
| Example 14 | 5 | N | $1.5 \times 10^5$ | $6.5 \times 10^8$ | 2.8 | N | 77 | 83 | 90 | 60 | 20 | 1.85 | 1.61 | N | $2.1 \times 10^5$ |
| Example 15 | 5 | N | <$1.0 \times 10^4$ | $8.9 \times 10^8$ | 2.8 | N | 90 | 92 | 28 | 10 | 20 | 1.58 | 1.38 | N | <$1.0 \times 10^4$ |
| Example 16 | 5 | N | <$1.0 \times 10^4$ | $1.1 \times 10^6$ | 1.8 | N | 90 | 91 | 28 | 9 | 20 | 1.57 | 1.41 | N | <$1.0 \times 10^4$ |
| Example 17 | 5 | N | <$1.0 \times 10^4$ | $8.1 \times 10^6$ | 2.8 | N | 90 | 91 | 29 | 10 | 20 | 1.52 | 1.40 | N | <$1.0 \times 10^4$ |
| Example 18 | 5 | N | <$1.0 \times 10^4$ | $5.6 \times 10^{11}$ | 3.2 | Y (*2) | 90 | 91 | 28 | 10 | 18 | 1.54 | 1.43 | N | <$1.0 \times 10^4$ |
| Example 19 | 5 | N | <$1.0 \times 10^4$ | $5.8 \times 10^7$ | 2.8 | N | 92 | 93 | 26 | 8 | 19 | 0.75 | 0.69 | Y | <$1.0 \times 10^4$ |
| Comp. Example 1 | 5 | N | >$1.0 \times 10^{14}$ | >$1.0 \times 10^{14}$ | 2.8 | N | 91 | 93 | 25 | 8 | 20 | 1.66 | 1.52 | N | >$1.0 \times 10^{14}$ |
| Comp. Example 2 | 5 | N | $8.5 \times 10^7$ | >$1.0 \times 10^{14}$ | 2.8 | Y (*2) | 90 | 91 | 26 | 10 | 20 | 1.45 | 1.36 | N | $8.9 \times 10^7$ |
| Comp. Example 3 | 2 (*1) | N | <$1.0 \times 10^4$ | $7.3 \times 10^7$ | 2.8 | N | 90 | 92 | 28 | 11 | 36 | 1.54 | 1.43 | N | <$1.0 \times 10^4$ |
| Comp. Example 4 | 5 | N | <$1.0 \times 10^4$ | $7.5 \times 10^7$ | 2.8 | N | 91 | 92 | 28 | 8 | 9 | 1.54 | 1.43 | N | <$1.0 \times 10^4$ |
| Comp. Example 5 | 5 | N | <$1.0 \times 10^4$ | $5.0 \times 10^7$ | 2.8 | N | 92 | 93 | 8 | 6 | 8 | 1.54 | 1.43 | N | <$1.0 \times 10^4$ |
| Comp. Example 6 | 5 | N | <$1.0 \times 10^4$ | $6.8 \times 10^7$ | 2.8 | N | 88 | 90 | 45 | 25 | 11 | 1.54 | 1.43 | N | <$1.0 \times 10^4$ |
| Comp. Example 7 | 5 | N | <$1.0 \times 10^4$ | >$1.0 \times 10^{14}$ | 2.8 | Y (*2) | 88 | 90 | 28 | 11 | 20 | 1.92 | 1.87 | N | <$1.0 \times 10^4$ |

Note
*1 The shape of the corner portions was poor.
*2 Cracks occurred in the conductive layer during formation.

<Measurement and Evaluation>

The raw material resins used in Examples 1 to 19 and Comparative Examples 1 to 7, and formed articles obtained by forming a surface conductive film on the surfaces of substrate sheets prepared from these raw material resins, then embossing, were evaluated by the below-described measurement methods.

(Molecular Weight of Raw Material Resin)

The molecular weights of (A) to (C) were determined as a standard polystyrene-converted weight-average molecular weight (Mw) using GPC (gel permeation chromatography). Tetrahydrofuran was used as the measuring solvent.

(Melt Tension of Raw Material Resin)

The melt tension (mN) was measured using a melt tension measuring apparatus (Toyo Seiki) with an orifice diameter of op 1.0 mm, an orifice length of 10 mm, windup speeds of 10, 30 and 50 m/min and a cylinder temperature of 220° C.

(Glass Transition Temperature of Raw Material Resin)

A dispersion comprising an aqueous dispersion of an acrylic copolymer resin was dried at 90° C.×1 min and formed into a thin film to create samples for use as measuring samples, which were measured using a DSC (differential scanning calorimeter manufactured by SII).

(Particle Size of Acrylic Copolymer Resin)

The particle size of the acrylic copolymer resin was measured using a Horiba laser diffraction/scattering type particle size distribution measurer LA-920 (the average particle size here was the median diameter).

(Formability of Sheets)

Using a pressure forming machine on substrate sheets having a surface conductive layer formed on each example and comparative example, pockets were formed of draw ratio 1.8 (pocket depth 3.0 mm), draw ratio 2.8 (pocket depth 6.0 mm) and draw ratio 3.2 (pocket depth 9.0 mm), and their formativeness was evaluated by evaluating the "sharpness" of the formed articles into five grades. Additionally, the pockets were visually inspected for the presence or absence of holes due to formation. The surface conductive layers were visually inspected for the presence or absence of cracks in the bottom surfaces of the pockets. FIG. 1 shows a formed article obtained by molding with a pressure forming machine.

The draw ratio was calculated using the below-given formula based on the dimensions of the formed article. Additionally, in these formed articles, the area of the bottom surface of the pockets was roughly equal to the area of the mouth portions of the pockets (areas enclosed by the solid lines).

Method of calculating draw ratio:

$$\text{Draw Ratio} = \text{pocket area (bottom area + four side areas)} / \text{pocket mouth area}$$

$$= (X \times Y) + 2 \times (X \times Z) + 2 \times (X \times Y)/(X \times Y)$$

(where X is the formed article advancement direction, Y is the direction perpendicular to the formed article advancement direction and Z is the pocket depth).

<Forming Conditions>

Pressure forming: heater temperature 220° C.

<Evaluation Standards of Formativeness>

As shown in FIG. 2, the pocket corners 11 of the formed articles 10 having pockets 20 formed therein were inspected, and their "sharpness" was visually evaluated into five grades in accordance with the samples 1 to 5 shown in FIG. 2.

(Transparency of Formed Articles)

The pocket side surfaces of the formed articles obtained by forming in a pressure forming machine were cut out, clamped between black plates with holes of φ 6 mm (28.26 mm²), and the bottom surfaces of the formed articles were measured for their haze and total light transmittance in accordance with the ASTM D1044 standard using a Hazegard plus from BYK Gardner of Germany. The standard haze value was such that the haze was 15% or less at the bottom surface of the formed article in order to provide transparency enabling components placed in the formed articles to be visually confirmed. Additionally, the standard total light transmittance was such that the total light transmittance was 85% or more at the bottom surface of the formed article in order to provide transparency enabling the components placed in the formed articles to be confirmed by observation devices such as microscopes.

(Surface Resistance of Formed Article)

Measurements were made at 23° C.×50% RH. The surface resistance was measured using a Mitsubishi Chemical Hiresta with a two-terminal probe (UA) as the probe. Additionally, the surface resistance of the entire pocket of the formed article was measured by a method as shown in FIG. 3. Additionally, the conductive layers on the pocket bottom surfaces and side surfaces were inspected by eye or microscope for the presence or absence of cracks during formation. Measurements were made by bringing a two-terminal probe into contact with the probe terminal contact positions 50a and 50b on the flanges 12a and 12b on both ends of the pocket. At this time, if the seal portions 13a and 13b of the carrier tape formed article 10 remain, then the conductive circuit 40 is formed on the seal portions 13a, 13b, so the entire pocket 20 cannot be measured. Therefore, as shown in FIG. 3, the seal portions 13a, 13b were cut along the dashed lines at cut positions 30a, 30b, the pocket side surfaces 60a, 60b were further cut away, and measurements were made while clamped in a jig of insulating material. The standard surface resistance value was on the order of $10^5$ or less in a formed body with a draw ratio of 1.5 to 3 when thermoforming, and on the order of $10^7$ or less for the formed article.

(Buckle Strength of Formed Article)

A Strograph (Toyo Seiki) was used to measure the strength of the pocket bottom surface portion of a formed article obtained by molding in a compressed-air former with the pocket mouth portion facing down, when compressed by 1.5 mm in the depth direction for a formed article of draw ratio 1.8 (pocket depth 3.0 mm), 3.0 mm for a formed article of draw ratio 2.8 (pocket depth 6.0 mm) and 4.5 mm for a formed article of draw ratio 3.2 (pocket depth 9.0 mm), and this was recorded as the buckle strength. In the event of a buckle strength of 15 N or more, the formed article is viable for use as a container.

(Coefficient of Friction Measurement)

The coefficient of static friction and the coefficient of kinetic friction were measured in accordance with JIS-7125 using a friction measurer (Toyo Seiki). The measurements were made with a sample size of 63 mm×63 mm, a load of 200 g and a speed of 500 mm/min. Additionally, the coefficient of static friction and the coefficient of kinetic friction were the coefficients of friction between conductive layers.

(Evaluation of Blocking)

Substrate sheets coated on both sides were slit into sheet samples 44 mm wide to produce 200 m wound slit raw sheets (winding tension 1.0 kgf). The slit raw sheets were stored for one week at 52° C.×95% RH. After one week, the slit raw sheets were extracted and the sheets were wound out. After unwinding, they were inspected for the presence or absence of blocking between the conductive layers on the surfaces of overlapping substrate sheets, and separation of the conductive layer due to blocking was evaluated by measuring the surface resistance between overlapping conductive layers at 23° C.×50% RH in accordance with JIS K6911, and observing whether the surface resistance increased.

The results shown in Table 5 revealed the following.

(i) Examples 1 to 18 using polystyrene type resin compositions of weight-average molecular weights in the predetermined ranges for the substrate sheet exhibited excellent formability, formativeness and sufficient buckle strength. In contrast, Comparative Example 3 using B-5 having a weight-average molecular weight of 470,000 Mw for (B) the polystyrene resin of the substrate sheet and C-6 having a weight-average molecular weight of 250,000 Mw as (C) the high impact polystyrene resin had problems in the formativeness. Additionally, Comparative Example 4 using A-6 having a weight-average molecular weight of 70,000 Mw as (A) the styrene-conjugated diene copolymer in the substrate sheet and C-5 having a weight-average molecular weight of 100,000 Mw as (C) the high impact polystyrene, Comparative Example 5 having a substrate sheet consisting only of the styrene-conjugated diene copolymer (A), and Comparative Example 6 not containing the polystyrene resin (B) all exhibited low buckle strength.

(ii) Examples 1 to 18 using polystyrene type resin compositions of weight-average molecular weights in the predetermined ranges for the substrate sheet and (D) an acrylic copolymer resin together with (E) an ion complex of a polythiophene type polymer and an anionic polymer for the surface conductive layer exhibited relatively low surface resistances as both sheets and formed articles. In contrast, the surface resistance of Comparative Example 1 not containing a polythiophene type polymer in the surface conductive layer was high, on the order of $10^{14}\Omega$ for both sheet and formed article, and Comparative Example 2 using tin oxide instead of a polythiophene type polymer in the surface conductive layer and Comparative Example 7 using an epoxy as the binder in the surface conductive layer both had high surface resistances on the order of $10^{14}\Omega$ for the formed article, and resulted in cracking of the conductive layer in the formed article.

While the present invention has been explained by referring to embodiments above, the technical scope of the present invention is naturally not limited to the scope described by the above embodiments. Those skilled in the art will recognize that various modifications and improvements could be made to the above-described embodiments. Additionally, the fact that embodiments including such modifications or improvements can still be contained within the technical scope of the present invention will be readily apparent from the recitations of the claims.

INDUSTRIAL APPLICABILITY

By making use of known methods for forming (thermoforming) sheets such as vacuum forming, pressure forming and press forming on the sheets for packaging electronic components of the present invention, it is possible to obtain electronic component packaging containers of any shape such as carrier tapes (embossed carrier tapes) and trays. Using the sheets for packaging electronic components of the present invention, it is possible to form packaging containers of large container depth, and packaging containers of excellent strength can be obtained. In particular, they are very useful for embossment of carrier tape. After placing electronic components in the receptacle portions, the embossed carrier tape is covered by cover tape and wound into reels to form carrier tape bodies, which can then be used to store and transport electronic components. Carrier tape bodies contain electronic components inside a carrier tape. There are no particular limitations on the electronic components to be packaged, and examples include IC's, LED's (light emitting diodes), resistors and capacitors. Additionally, they can be used for packaging intermediary products or final products using such electronic components.

DESCRIPTION OF REFERENCE NUMBERS 10 formed article
11 pocket corner
12a, 12b flange
13a, 13b seal portion
20 pocket
30a, 30b cut position
40 conductive circuit
50a, 50b probe terminal contact position

The invention claimed is:

1. An electronic component packaging sheet having a surface conductive layer formed on a surface on at least one side of a substrate sheet, wherein
the substrate sheet comprises a styrene-butadiene block copolymer (A), a polystyrene resin (B), and a high impact polystyrene resin (C), which is a polystyrene resin comprising microparticulate graft rubber to which styrenic monomers have been grafted, the components having the following weight-average molecular weights (Mw):
component (A): Mw=80,000 to 220,000;
component (B): Mw=200,000 to 400,000;
component (C): Mw=150,000 to 210,000; and
the surface conductive layer comprising an acrylic copolymer resin (D) and a polythiophene-based polymer, wherein
the substrate sheet, at 220° C. and with a windup speed of 10 to 50 m/min, has a melt tension of 14 to 30 mN,
the substrate sheet is formed of a resin composition comprising 35 to 58 mass % component (A), 51 to 25 mass % component (B) and 20 to 9 mass % component (C),
the polythiophene-based polymer is an ion complex (E) of a polythiophene polymer and an anionic polymer,
the surface conductive layer comprises 15 to 48 mass % of the ion complex (E) and 52 to 85 mass % of the acrylic copolymer resin (D), and
the peak molecular weight by GPC of polymer blocks of styrenic monomers in component (A) is in the range of 30,000 to 120,000; and a half-width of a molecular weight distribution curve of the polymer blocks of the styrenic monomers is in the range of 0.8 to 1.11.

2. The electronic component packaging sheet of claim 1, wherein a rubber component in the graft rubber in component (C) is a diene rubber monomer selected from the group consisting of 1,3-butadiene (butadiene), 2-methyl-1,3-butadiene (isoprene), 2,3-dimethyl-1,3-butadiene, 1,3-pentadiene, 1,3-hexadiene and 2-methylpentadiene, or the graft rubber is a thermoplastic elastomer of a styrene-conjugated diene block copolymer wherein the diene component is at least 50 mass %.

3. The electronic component packaging sheet of claim 1, wherein the particle size of the graft rubber in component (C) is 2.0 to 3.0 µm, and the proportion of rubber in the graft rubber in the substrate sheet is 0.75 to 1.90 mass %.

4. The electronic component packaging sheet of claim 1, wherein, before the surface conductive layer is formed, the particle size in a dispersion of the acrylic copolymer resin (D) in the surface conductive layer is 80 to 350 nm in a median diameter.

5. The electronic component packaging sheet of claim 1, wherein the glass transition temperature Tg of the acrylic copolymer resin (D) in the surface conductive layer is 25 to 80° C.

6. The electronic component packaging sheet of claim 1, wherein the coefficient of static friction between the conductive layer formed on the surface of the substrate sheet and another conductive layer is at least 0.85 and at most 2.50, and the coefficient of kinetic friction between the conductive layer and another conductive layer is at least 0.85 and at most 2.50.

7. A method for producing the electronic component packaging sheet of claim 1, comprising a step of applying a dispersion mixture of an aqueous dispersion of the ion complex (E) and an aqueous dispersion of the acrylic copolymer resin (D) to the surface on at least one side of the substrate sheet, wherein the particle size in the dispersion of the acrylic copolymer resin (D) in the surface conductive layer is 80 to 350 nm in a median diameter.

8. A formed article obtained by thermoforming the electronic component packaging sheet of claim 1.

9. The formed article of claim 8, wherein the surface resistance of the formed article with a draw ratio for thermoforming of 1.5 to 3 times is on the order of $10^5 \Omega$ to $10^7 \Omega$.

10. The formed article of claim 8, which is in the form of an embossed carrier tape.

* * * * *